United States Patent
Ito

(10) Patent No.: US 7,768,156 B2
(45) Date of Patent: *Aug. 3, 2010

(54) COIL SUPPORT UNIT, MOTOR AND EXPOSURE APPARATUS USING THE SAME, AND DEVICE MANUFACTURING METHOD

(75) Inventor: Atsushi Ito, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/018,299

(22) Filed: Jan. 23, 2008

(65) Prior Publication Data

US 2008/0303354 A1    Dec. 11, 2008

Related U.S. Application Data

(63) Continuation of application No. 10/973,469, filed on Oct. 27, 2004, now Pat. No. 7,329,972.

(30) Foreign Application Priority Data

Nov. 28, 2003    (JP) .............................. 2003-399884

(51) Int. Cl.
   *H02K 41/02*    (2006.01)
(52) U.S. Cl. .................... 310/12.06; 310/12.22; 310/16
(58) Field of Classification Search .................. 310/12, 310/13, 15, 16, 17, 12.06, 12.21, 12.22, 12.25; 335/53–54, 74

See application file for complete search history.

(56) References Cited

U.S. PATENT DOCUMENTS

| | | | |
|---|---|---|---|
| 6,084,319 A | 7/2000 | Kamata et al. | 310/12 |
| 6,445,093 B1 * | 9/2002 | Binnard | 310/12.06 |
| 6,639,333 B1 | 10/2003 | Kamata et al. | 310/12 |
| 6,836,031 B2 | 12/2004 | Emoto et al. | 310/12 |
| 7,329,972 B2 * | 2/2008 | Ito | 310/12 |
| 2003/0011254 A1 | 1/2003 | Ukaji | 310/64 |
| 2005/0116549 A1 | 6/2005 | Ito | 310/12 |

FOREIGN PATENT DOCUMENTS

JP    5-304761    11/1993

(Continued)

OTHER PUBLICATIONS

European Search Report dated Apr. 26, 2006, issued in corresponding European patent Application No. EP 04 25 6775, forwarded in a Communication dated May 12, 2006.

(Continued)

*Primary Examiner*—Quyen Leung
*Assistant Examiner*—David W. Scheuermann
(74) *Attorney, Agent, or Firm*—Fitzpatrick, Cella, Harper & Scinto

(57) ABSTRACT

A motor apparatus includes a plurality of coils arranged along a first direction in a plane perpendicular to central axes thereof, a plurality of magnets each generating a force in cooperation with the coils, and a support member supporting the plurality of coils. Movement of the coils in the first direction due to thermal deformation of the coils is constrained by the coils contacting with a surface of the support member, and movement of the coils in a second direction, which is in the plane and perpendicular to the first direction, due to thermal deformation of the coils, is allowed by the coils sliding in the second direction along the surface.

21 Claims, 12 Drawing Sheets

FOREIGN PATENT DOCUMENTS

| | | |
|---|---|---|
| JP | 7-163127 | 6/1995 |
| JP | 10-309071 | 11/1998 |
| JP | 2000-32733 | 1/2000 |
| JP | 2000-50614 | 2/2000 |
| JP | 2002-34104 | 1/2002 |
| JP | 2002-176761 | 6/2002 |
| JP | 2003-274593 | 9/2003 |

OTHER PUBLICATIONS

Japanese Office Action dated Sep. 30, 2008, issued in corresponding Japanese patent application No. 2003-399884.

Japanese Office Action dated Aug. 4, 2009, issued in corresponding Japanese patent application No. 2003-399884, with an English translation.

* cited by examiner xz : THRUST DIRECTION
y : THERMAL EXPANSION DIRECTION

COIL SUPPORT UNIT, MOTOR AND EXPOSURE APPARATUS USING THE SAME, AND DEVICE MANUFACTURING METHOD

This application is a continuation application of U.S. patent application Ser. No. 10/973,469, filed Oct. 27, 2004.

This application also claims priority from Japanese Patent Application No. 2003-399884, filed on Nov. 28, 2003, which is hereby incorporated by reference herein.

FIELD OF THE INVENTION

The present invention relates to a coil support unit which supports a coil, more preferably, to a coil support unit in a linear or plane motor used in a stage device of a semiconductor exposure apparatus, and to a device manufacturing method using the above exposure apparatus.

BACKGROUND OF THE INVENTION

Conventionally, in a lithography process of manufacturing a semiconductor device, a liquid crystal display device, and the like, an exposure apparatus is used for transferring a pattern formed on a mask or reticle (to be generally called a "master" hereinafter) serving as a master, via a projection optical system, onto a wafer or glass plate (to be generally called a "substrate" hereinafter) serving as a substrate to which a resist, or the like, is applied.

In a stage device on the nanometer order used in the exposure apparatus, a high-precision processing machine, and the like, a high-output linear motor is required along with an improvement in performance of the stage device. However, when increasing a current amount flowing to the coil of the linear motor, a heat amount is also greatly increased. Hence, a cooling capacity must be further increased. Also, it is important to increase the cooling capacity of the coil in order to prevent the increase in coil resistance, and damage to the coil wire caused by the increase in temperature of the coil.

An example of the conventional coil support unit in the linear motor is described in Japanese Patent Laid-Open No. 10-309071 (see FIG. 12). In FIG. 12, coils 1a, 1b, and 1c are partially and directly adhered and fixed to jackets 14 and 14' by epoxy resin or an adhesive, and then, a coolant flows between the jackets. Thus, the coil is directly cooled to collect the generated heat, and the rate of increase in temperature of the coil decreases.

Recently, a higher-speed, higher-precision, and longer-life stage device is required. Hence, the stage device has been developed, which aligns the substrate by two-dimensionally driving, in a noncontact manner, the stage on which the substrate is mounted. As a driving source of the stage device, which drives the stage in a noncontact manner, a plane motor has been known.

The plane motor has a stage, including a magnet portion serving as a movable portion which moves along X and Y directions, and a base serving as a fixed portion. The fixed portion of the plane motor has a plurality of coils stacked in, e.g., a Z direction. A current selectively flows to the coils of each layer to generate a force acting on the stage in a predetermined direction.

In the coil support unit which supports the coil by adhesion, when a thermal expansion force is larger than an adhesion force, the coil may be separated by the thermal expansion force, and the positional accuracy of the coil may be deteriorated. Also, a coil coating may be peeled off, thereby causing a short circuit. A design limitation is imposed on an increase in the adhesion area for increasing the adhesion force. For example, when a coolant directly cools the coil, the adhesion area of the coil must be minimal. Also, when a fixing means fixes the coil in all directions, the coil may locally deform by the thermal expansion force.

Furthermore, in the plane motor where the stacked coils are juxtaposed in the Z direction, when the distance between the movable portion (magnet portion) and the coil becomes longer as the number of layers increases, the heat increases to obtain the same thrust. When forming a coolant channel around the coil in order to decrease the heat, the distance between the movable portion and the coil becomes longer by the channel space, and the heat further increases. Thus, an assembly operation is also difficult to support the coil layer at high precision while ensuring the space for the coolant channel.

SUMMARY OF THE INVENTION

The present invention has been made to provide a coil support unit, which supports a coil, which generates a thrust to a movable portion such that stable thrust characteristics can be obtained, and a motor and an exposure apparatus using the coil support unit.

In order to achieve the above object, in the present invention, a coil support unit which supports, by a coil support portion, a coil for generating a thrust to a movable portion, is characterized in that the coil support portion constrains the coil in a thrust direction, and slidably supports the coil in a direction perpendicular to the thrust direction on a moving surface of the movable portion. Note that the "coil support portion" is a portion where the coil or a spacer is attached. For example, the coil support portion can include the wall surface of a cooling jacket for cooling a coil housing or the coil, and a rib, column, and the like, which are fixed to the wall surfaces.

Preferably, the coil is a substantially elliptical coil, and the sliding direction is a major-axis direction of the coil. Note that the "substantially elliptical coil" is a coil having a major-axis (long side) in one direction. The substantially elliptical coil includes a race track coil whose arc in the major-axis direction is linear, a rectangular coil, and a substantially rectangular coil, which is rectangular without an acute angle.

A force can be relieved in the major-axis direction of the coil where a large thermal expansion force is generated, and the possibility of local deformation of the coil can be reduced. Also, the coil is constrained and supported in the minor-axis direction where a small thermal expansion force is generated. Hence, the coil is prevented from shifting caused by the thrust, and stable thrust characteristics can be obtained.

Preferably, the coil support portion detachably supports the coil.

This eliminates the cause of decreasing a yield, such as the case wherein the coil is undesirably separated from the coil support portion by an adhesion error in assembling. Furthermore, since the coil need not be adhered at a plurality of portions, efficiency, and the yield, can increase.

Preferably, the coil support unit further comprises a spacer between the coil and the coil support portion, and the coil support portion slidably supports the spacer in the sliding direction. Since a fitting management between the spacer attached to the coil and the coil support portion is relaxed, the yield can increase.

Preferably, the coil is a substantially elliptical coil with a plurality of spacers, and the coil support portion includes a plurality of ribs juxtaposed in a major-axis direction. Since the fitting management between the plurality of spacers attached to the coils and the coil support portion is relaxed, the yield increases.

Preferably, the coil is constrained by friction applied on a coil surface. Note that the "coil surface" is an X-Y plane formed by coil windings. When the spacer is provided, the coil surface includes a spacer surface. The coil can be constrained (aligned) in the thrust direction without abutting the coil or the spacer against the coil support portion. Hence, the fitting management between the coil or spacer and the coil support portion is remarkably relaxed.

Preferably, the coil support unit comprises preload force applying means for applying a preload force to the coil in a direction perpendicular to the coil surface. The coil can be constrained and slid by adjusting friction by applying the preload force. Hence, the position of the coil can be easily adjusted. In this case, preferably, the friction is larger than the thrust, and is smaller than a thermal expansion force in the sliding direction of the coil.

As a means for constraining the coil in the thrust direction, and slidably supporting the coil in a direction perpendicular to the thrust direction on the moving surface of the movable portion, the coil support portion can support the coil by an anisotropic spring. In this case, preferably, the coil includes a spacer between the coil and the coil support portion, and the spacer includes the anisotropic spring. In addition to these arrangements, the coil can include a wedge portion, and the wedge portion can support the coil. Since the space between the coil and the spacer need not be fixed, for example, a time for adhesion between the coil and the spacer can be decreased. When a coil body is slidably arranged, preferably, a protective material is provided between the coil and a sliding surface on which the coil slides. Note that the "protective material" is a protective tape, a protective film, or the like. It suffices if the protective material can protect the coil coating from not being peeled off, and the coil from being damaged by a short circuit.

Preferably, the coil includes multilayered coils stacked in a direction perpendicular to a moving surface. Also, preferably, the coil support portion includes a rib, and the single rib supports the multilayered coils. The yield and space efficiency further increase. For example, the single rib serves as a means for constraining the plurality of multilayered coils, thereby saving space. When the coil is detachable, the yield can remarkably increase.

Preferably, the coil support unit further comprises preload force applying means for applying a preload force to the multilayered coils in a direction perpendicular to the moving surface, and the preload force applying means is arranged to the coil on the opposite side of the movable portion in a direction perpendicular to the moving surface. Since the multilayered coils can be supported with a short distance between the movable portion and the coil, the thrust efficiency increases.

Preferably, the coil support portion, which supports the coil, is integrated with a cooling jacket, which cools the coil, and the coil is cooled in the cooling jacket. The heat of the coil can decrease, thereby ensuring the thrust and saving space in the above-described coil support unit.

The above-described coil support unit is preferably used in a linear or plane motor. Preferably, an exposure apparatus drives, using these motors, a stage on which a substrate is mounted. Also, the exposure apparatus preferably manufactures a device. A high-precision motor apparatus, a high-precision exposure apparatus, and a highly integrated device can be expected to be manufactured.

Other features and advantages of the present invention will be apparent from the following description taken in conjunction with the accompanying drawings, in which like reference characters designate the same or similar parts throughout the figures thereof.

DETAILED DESCRIPTION OF THE PREFERRED EMBODIMENTS

First Embodiment

Figure 1A:
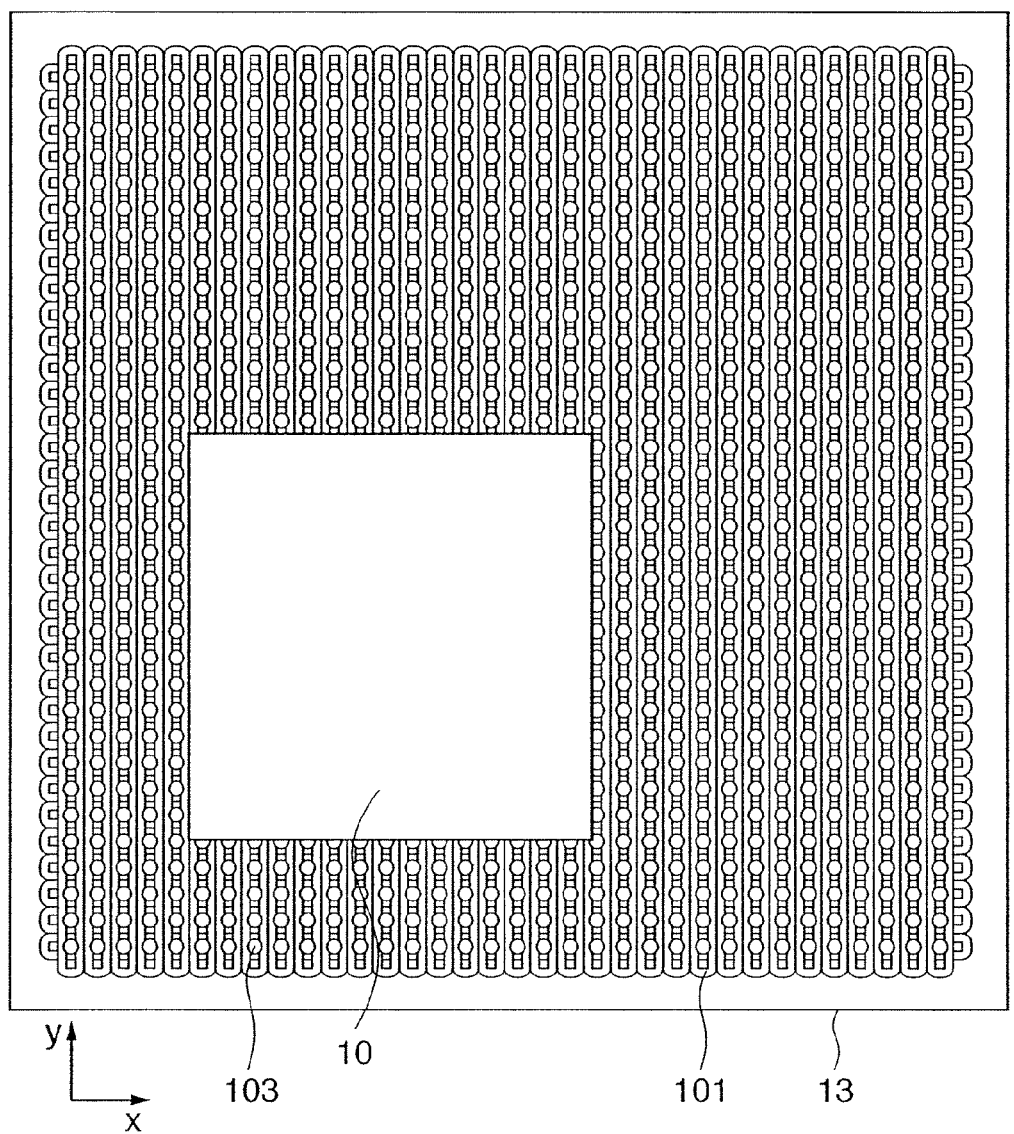
FIGS. 1A and 1B are views showing a coil support unit according to the first embodiment.
Figure 1B:
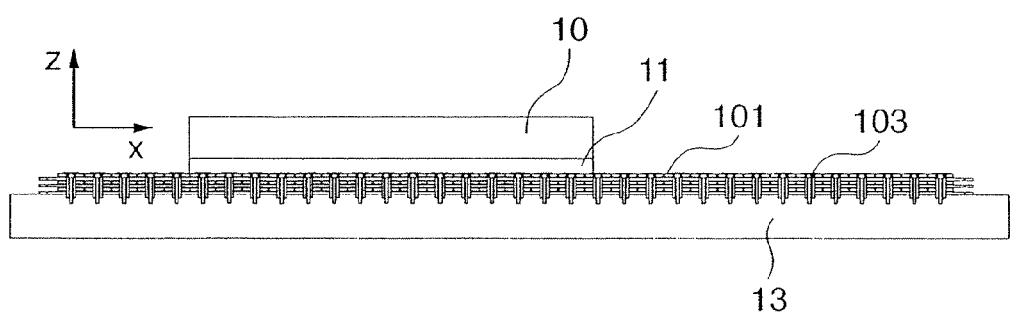
Figure 2:
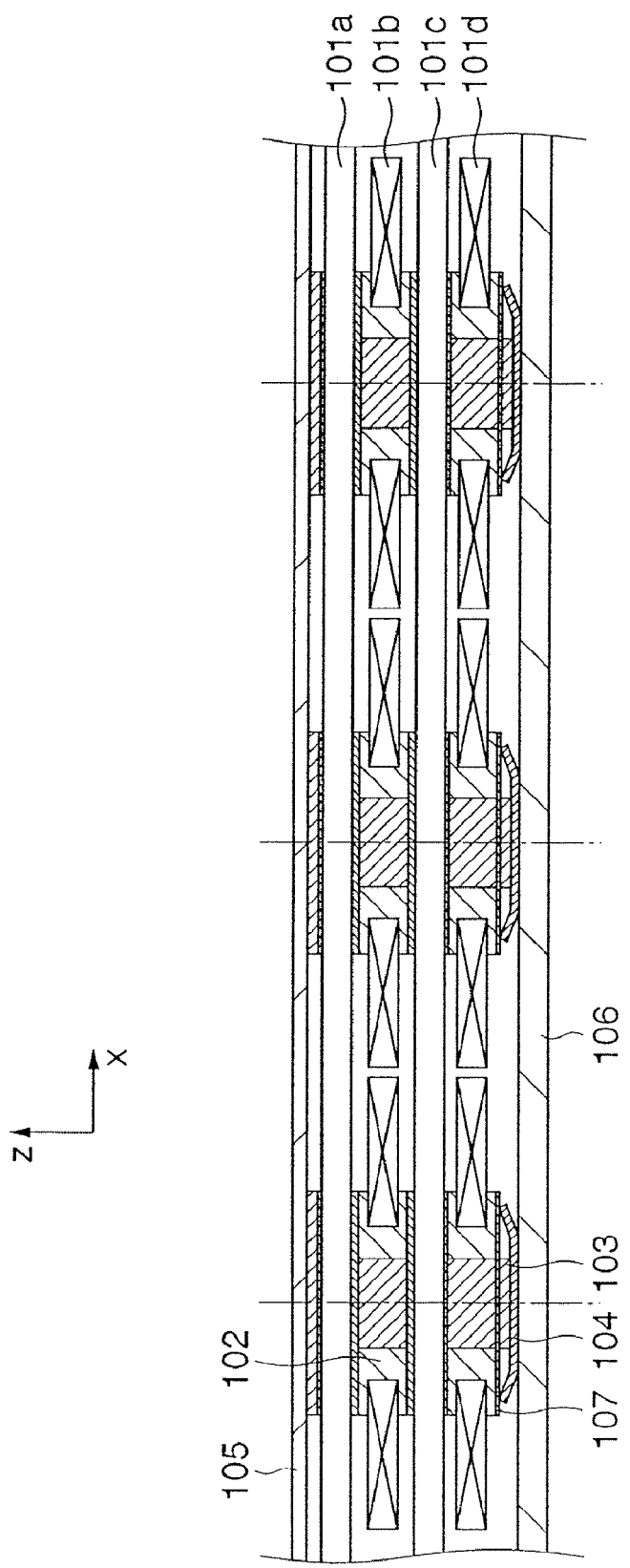
FIG. 2 is a schematic view of a plane motor.

FIGS. 1A and 1B are views showing a plane motor according to the first embodiment of the present invention. FIG. 2 is a view showing a coil support unit in FIG. 1B. Since, in FIGS. 1A and 1B, a surface plate serving as a moving surface of a movable portion 10 is omitted for the sake of simplicity, a coil 101 is exposed. However, in an actual unit, the coil 101 is covered with a surface plate. The stage 10 serving as an object has a magnet portion 11, and can be driven in the X and Y directions by selectively causing a current to flow to the coil 101 on a base 13.

Figure 3:
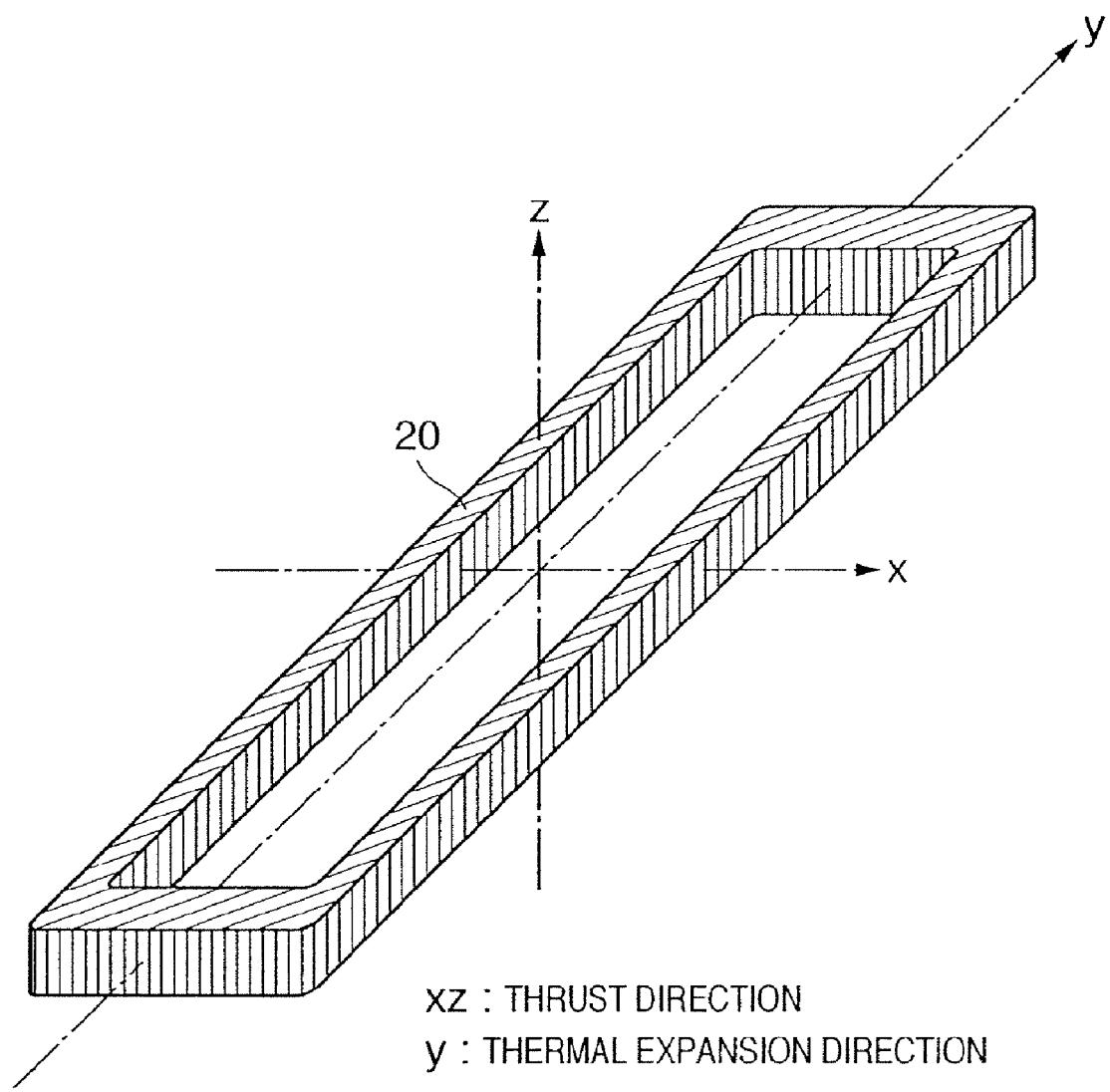
FIG. 3 is a view showing a substantially elliptical coil.

For example, on the first layer from the top (movable portion side), the coil 101 includes substantially elliptical coils 101a with an elliptical (long side) portion in an X direction, and the plurality of substantially elliptical coils 101a are juxtaposed in a Y direction. On the second layer, the coil 101 includes substantially elliptical coils 101b with an elliptical portion in a Y direction, and the plurality of substantially elliptical coils 101b are juxtaposed in the X direction. Also, on each of the remaining layers, the coil 101 includes the group of coils (101c, 101d) with an elliptical portion in a predetermined direction. FIG. 3 shows the substantially elliptical coil 101b according to this embodiment. The remaining coils also have the same shape as the substantially elliptical coil 101b, except for the major-axis direction. The substantially elliptical coil 101b has substantially plane portions (coil surfaces) on its upper and lower surfaces in a Z direction.

Since a current flows in the elliptical direction of the substantially elliptical coil 101a in the X direction, a Lorentz force is applied, in the direction of a Y-Z plane, between the coil 101a and the magnet portion 11 arranged on the movable portion. Since a current flows in the elliptical portion of the substantially elliptical coil 101b in the Y direction, the Lorentz force is applied to the movable portion (magnet portion) in the direction of an X-Z plane. In this case, the long-side direction of the coil, the number of coils, the number of coil layers, and the like, are arbitrarily designed in accordance with the object of the stage to be driven. For example, the stage can be driven along six axes, such as an X, Y, Z, θ (a rotational direction about the Z-axis), ωx (a rotational direction about the X-axis), and ωy (a rotational direction about the Y-axis).

The coil 101 is arranged in a cooling jacket (a space between a jacket ceiling plate 105 and a jacket wall 106), and a plurality of ribs 103 for supporting the coil are fixed to the cooling jacket. The plurality of ribs 103 are arranged on each of the coils in the major-axis direction, as shown in FIG. 1A, and support the coil in the inner circumferential portion of the coil 101 via the spacer.

Figure 4A:
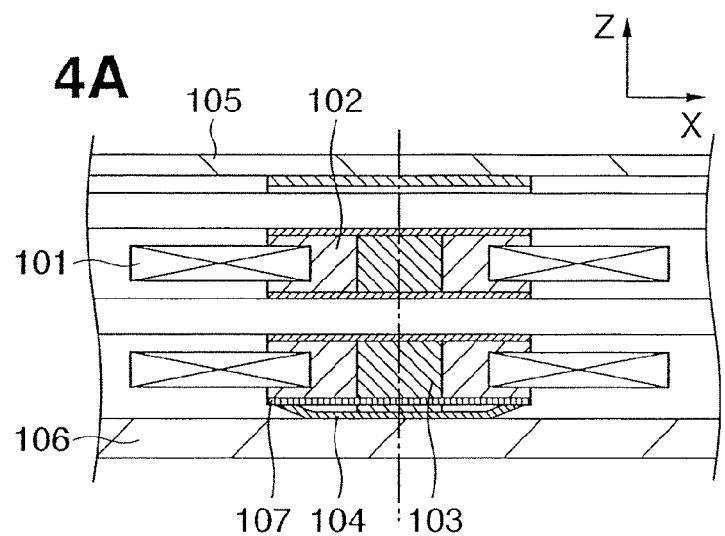
FIGS. 4A to 4C are enlarged views of the coil support unit according to the first embodiment.

FIG. 4A is an enlarged view of the coil support unit in FIG. 2. The coils 101 are attached to spacers 102, and the spacers 102 are stacked around the rib 103 in the Z direction. A cone disc spring 104 applies a preload force to the multilayered spacers 102 in the Z direction to constrain and to support the spacers 102 to the jacket wall 106 and jacket ceiling plate 105.

Friction acts between the multilayered spacers 102, between the spacer 102 and the cone disc spring 104, and between the spacer 102 and the rib 103, by the preload force applied by the cone disc spring 104. The preload force is set such that the friction becomes smaller than a thermal expansion force in the major-axis direction of the coil 101 (for example, the Y direction when the coil 101b is used). Note that when setting the preload force, in consideration of the accumulated tolerance of dimensional tolerances of the spacers 102, the spring constant of the cone disc spring 104 may be determined such that the preload force falls within the above-described range in assembling the coil support unit. Also, the preload force may be adjusted by inserting a shim 107 with an optimal thickness between the cone disc spring 104 and the spacer 102. At this time, the coil can be prevented from locally deforming by relieving the thermal expansion force in the direction, which is not associated with a thrust (in the X direction when the coil 101b is used). Specifically, when the thermal expansion force is relieved in the major-axis direction of the elliptical coil, the effect can be further expected.

The shim 107 also serves as a sliding surface with the spacer 102. That is, when using the shim 107, the friction acts between the spacer 102 and the shim 107. Hence, the friction can also be adjusted by changing the material of the shim 107. When this friction is set to be smaller than the thermal expansion force in the major-axis direction of the coil, the coil can slide in only the major-axis direction, and the thermal expansion force of the coil 101 can be relieved.

Note that the cone disc spring 104 may be arranged in any position as long as the cone disc spring 104 applies the preload force to the spacer 102, and the preload force applying means need not be a cone disc spring. As an effect of the cone disc spring, the preload force can be applied in a small space, and the cone disc spring can be obtained at a low cost, because the cone disc spring has a simple structure. Since the cone disc spring is arranged at the portion opposite to the movable portion (not arranged between the coil and the magnet), the distance between the coil and the magnet can be made short.

The spacer 102 is preferably made from a material which can resist a sliding operation for a long term. For example, the material may include polyphenylene sulfide (PPS), polyetheretherketone (PEEK), polybutylene terephthalate (PBT), or fluoroplastic. The friction can be adjusted by the material of the spacer.

The spacer 102 and the coil 101 can be fixed by any method as long as the friction is larger than the thermal expansion force of the coil 101. The spacer 102 and the coil 101 can be fixed by adhesion. This is because, since the large thermal expansion force applied to the coil 101 is relieved by sliding the spacer 102, a large stress does not act on the adhesion portion, and the possibility of the separation of the coil is low. Also, since the coil 101 is not adhered to the cooling jacket, it is easy to attach and to remove the coil. Even when a problem occurs, the yield may increase, since the coil can be easily replaced.

A coolant whose temperature is managed flows into the space enclosed by the jacket wall 106 and the jacket ceiling plate 105. Hence, the heat of the coil 101 is exchanged, and the increase in temperature is prevented. In order to increase the cooling capacity, it is effective to make the spacer 102 thick to have a wide space between the coils 101, and to increase the flow rate of the coolant. However, in this case, the gap between the coil 101 and the magnet portion serving as the movable portion becomes wide, and a thrust constant is decreased. Therefore, a large current for generating the desired thrust is required, and the heat amount of the coil 101 increases. Therefore, the spacer 102 may have the optimal thickness for balance between a coolant channel and the thrust constant.

Figure 4B:
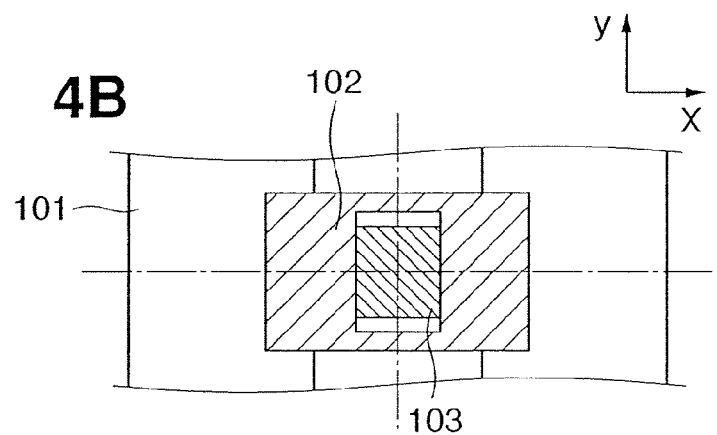
Figure 4C:
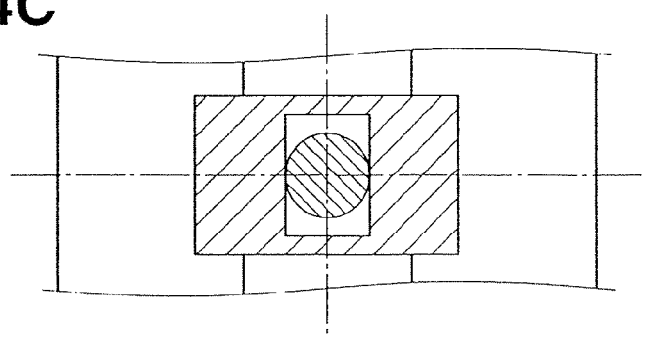

FIG. 4B is a view of the rib seen from the Z direction. A hole is formed in the spacer 102, and the size of the hole is managed such that the two sides of the rib 103 abut against the spacer 102 in the X direction, and such that the two sides of the rib 103 are separated from the spacer 102 to be slidable in the Y direction. In FIG. 4C, the columnar rib is arranged to be easily attached the coil, which is inserted into the spacer to each of the ribs juxtaposed in the Y direction.

Figure 5:
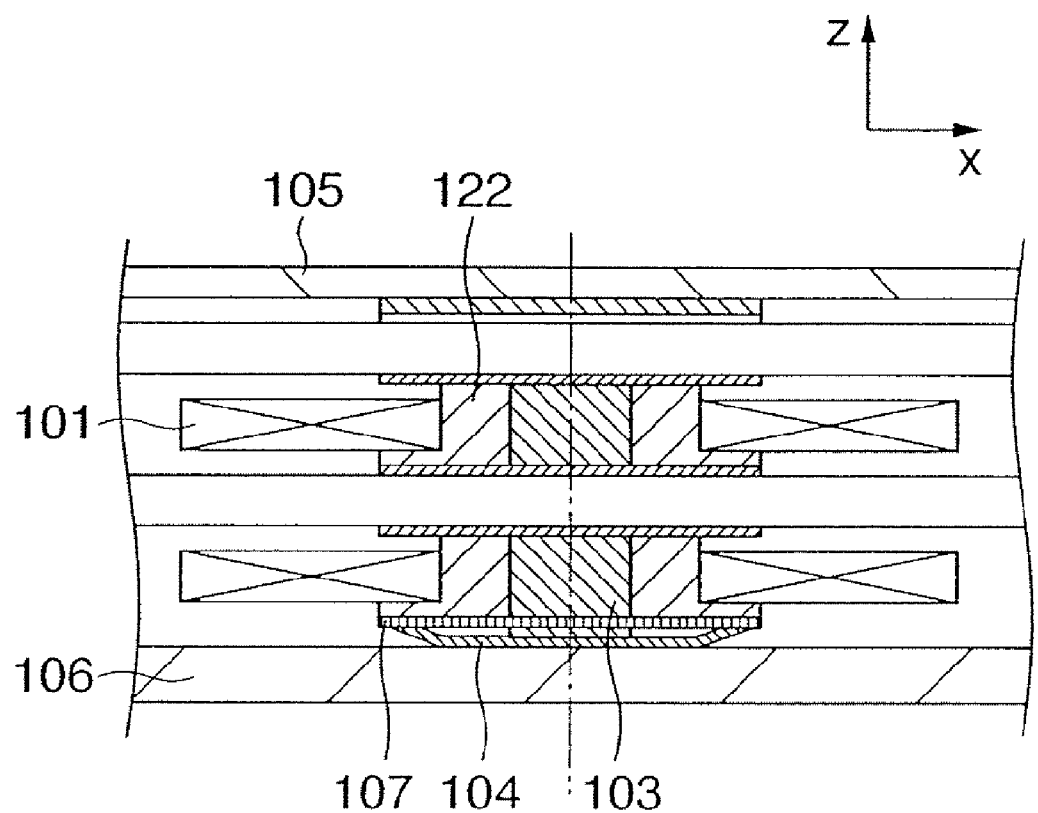
FIG. 5 is a view showing a coil support unit with an L-shaped spacer.

FIG. 5 shows an example in which the shape of the spacer attached to the coil is changed. A spacer 122 fixes the lower and side surfaces of the coil 101, and the coils 101 are juxtaposed around the rib 103, as shown in FIG. 4A. Since the spacer has an L-shaped cross section, the spacer 122 is easily attached to the coil 101, and the assembly efficiency can increase. Since the upper end face of the spacer is set to be higher than the upper surface of the coil, the short circuit of the coil can be prevented, and the adhesion area in which the coil 101 contacts the coolant can be ensured.

Second Embodiment

Figure 6A:
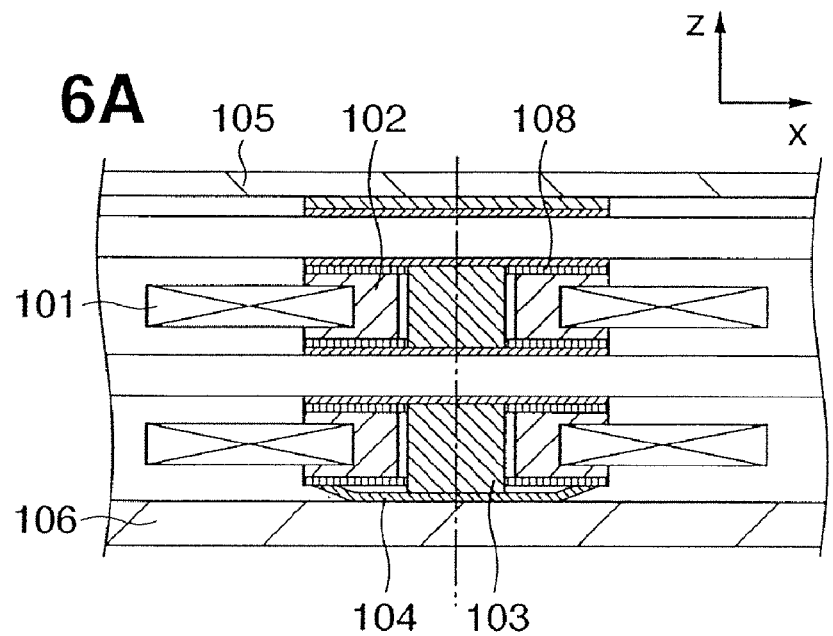
FIGS. 6A and 6B are views showing a coil support unit using a shim.
Figure 6B:
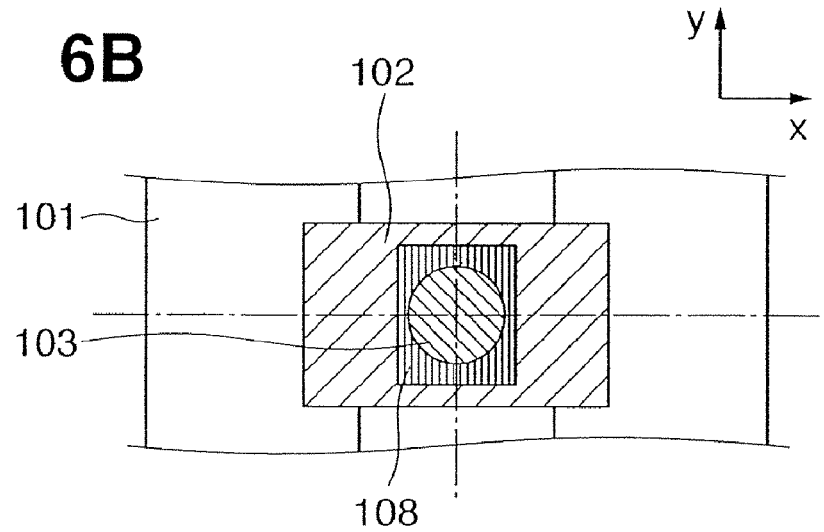

FIGS. 6A and 6B are views showing the second embodiment. FIG. 6A is an enlarged view of a coil support unit seen from a Y direction. FIG. 6B is a view of a coil having an elliptical portion in the Y direction (e.g., the coil on the second layer in FIG. 6A), seen from a Z direction. The detailed description of the similar arrangement of the first embodiment will be omitted. In the second embodiment, a spacer 102 does not abut against a rib 103 in the X direction and a major-axis direction (Y direction) of the thrust directions. Between the spacers 102 stacked in the Z direction, a shim 108 is arranged to abut against the rib in the X and Y directions.

When a cone disc spring 104 applies a preload force to generate the optimal friction between the spacer 102 and the shim 108, the spacer 102 can be constrained in the thrust direction. In this case, the preload force is set such that the friction is larger than the thrust of the coil 101, and smaller than the thermal expansion force of the coil.

Note that when setting the preload force, in consideration of the accumulated tolerance of dimensional tolerances of the spacers 102, the spring constant of the cone disc spring 104 may be determined such that the preload force falls within the above-described range in assembling the coil support unit, or the preload force maybe be adjusted by adjusting the thickness of the shim 108. Note that the cone disc spring 104 may be arranged in any position as long as the cone disc spring 104 applies the preload force to the spacer, and the means need not be a cone disc spring 104 as long as the purpose is achieved. Also, the shim 108 serves as a sliding surface with the spacer 102.

In this arrangement, the coil 101 is constrained by the friction in the direction of a moving surface of the thrust directions, constrained by abutting in the Z direction of the thrust directions. The spacer 102 can slide, since the thermal expansion force of the coil exceeds the friction in the major-axis direction, thereby relieving the thermal expansion force in the major-axis of the coil 101. Since the shim 108 is fixed in the X and Y directions, the coils on the respective layers do not interfere with each other by the thermal expansion forces of the coils. For example, when the thermal expansion force of the coil on the first layer is relieved in the X direction, the coil on the second layer is not interfered with by the thermal expansion force in the X direction, since the shim 108 is fixed. Also, in this arrangement, since the spacer 102 need not abut against the rib 103, strict fitting management between the spacer 102 and the rib 103 is not required. Hence, the assembly efficiency remarkably increases. More specifically, when the substantially elliptical coil in the Y or X direction needs to be supported by the plurality of ribs, as in this embodiment, a great effect is produced.

In the above-described arrangement, the coil can slide in the major-axis direction when the large thermal expansion force is generated without changing the thrust characteristics of the substantially elliptical coil. A coil support arrangement reliable for eliminating damage to the coil can thereby be obtained. Also, the assembly efficiency and the yield increase.

Third Embodiment

Figure 7A:
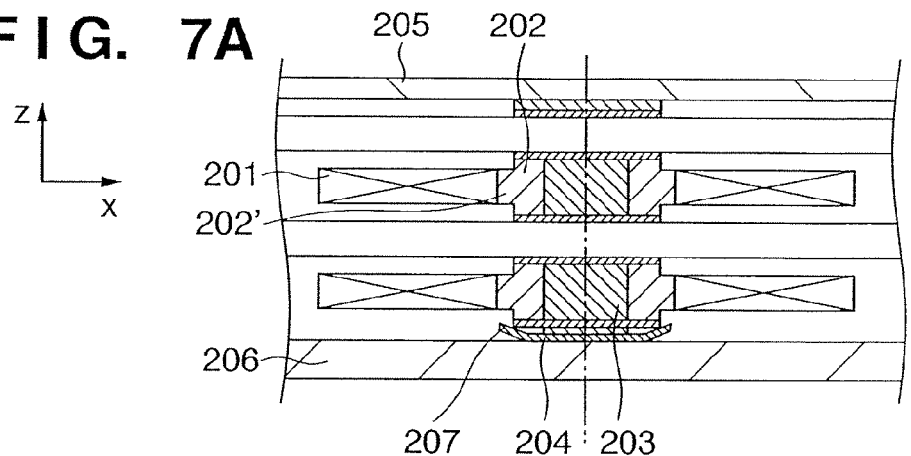
FIGS. 7A to 7E are views showing a coil support unit using a leaf spring.

FIGS. 7A to 7E show the third embodiment. FIG. 7A is a view of a coil support unit seen from a Y direction. FIGS. 7B to 7E are views of a coil having an elliptical portion in the Y direction (e.g., the coil on the second layer in FIG. 7A), seen from a Z direction. A detailed description of the arrangement similar to the first embodiment will be omitted. As one characteristic of this embodiment, a coil can slide with a spacer in this embodiment, while the spacer can slide in a major-axis direction in the first and second embodiments. A leaf spring 202' serving as an anisotropic spring is used to support a coil 201 to move the coil 201 only in one direction. The leaf spring 202' is integrated with a spacer 202 between the coil 201 and a rib 203 serving as a coil support portion.

In this case, in consideration of efficiency, cone disc spring 204 applies a preload force to the spacer 202 in the Z direction to support the spacer 202, although the spacer 202 may be fixed to the rib 203. This preload force is used to suppress play caused by the dimensional error in the Z direction of the spacer 202, and to constrain and to support the spacer 202. Any means can be used, e.g., a shim 207 with an optimal thickness can be inserted, as long as the above purposed is achieved.

Since an anisotropic spring, which is rigid in a thrust direction and flexible in the major-axis direction, is used, the coil 201 can be rigidly constrained in the thrust direction, and moved in the major-axis direction by the leaf spring 202'. Hence, the thermal expansion force in the major-axis direction can be relieved. The arrangements of the coil 201 and the leaf spring 202' can be varied as long as the efficiency is not interfered with. Some examples are described below.

Figure 7B:
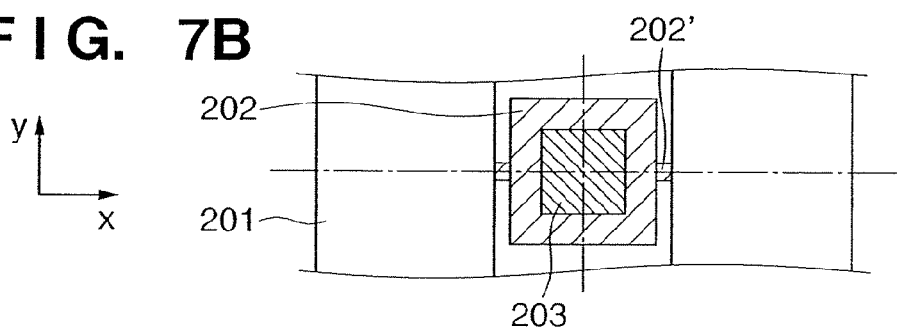
Figure 7C:
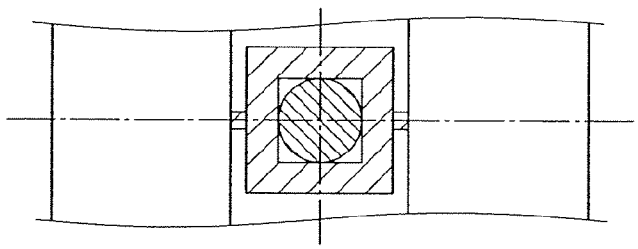
Figure 7D:
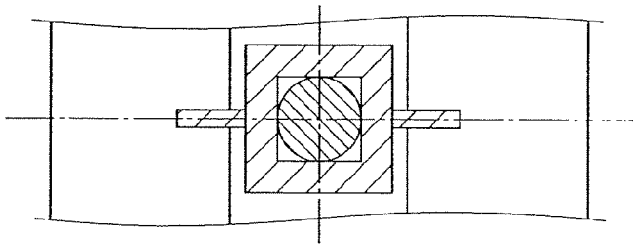
Figure 7E:
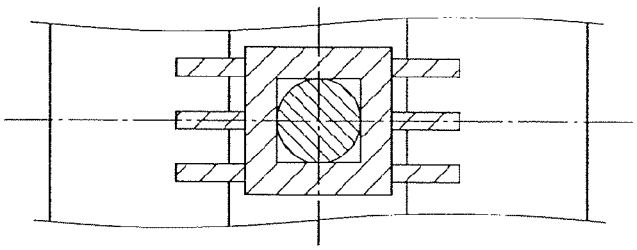

In FIG. 7B, since the position of the spacer is determined by abutting against the rib in the X and Y directions, the slide of the spacer can be mechanically suppressed. In FIG. 7C, the columnar rib is arranged to facilitate attaching the coils inserted into the spacers to the plurality of ribs, which are juxtaposed in the Y direction. In FIG. 7D, the leaf spring is fixed to the upper and lower surfaces of the coil to increase the constraint force applied to the coil in the Z direction. In FIG. 7E, a plurality of leaf springs support the coils to increase the constraint force applied to the coils in the Z direction.

In the above arrangement, the coil is rigidly constrained in the thrust direction, and can move in the major-axis direction. Hence, the thermal expansion force of the coil can be relieved.

Fourth Embodiment

Figure 8A:
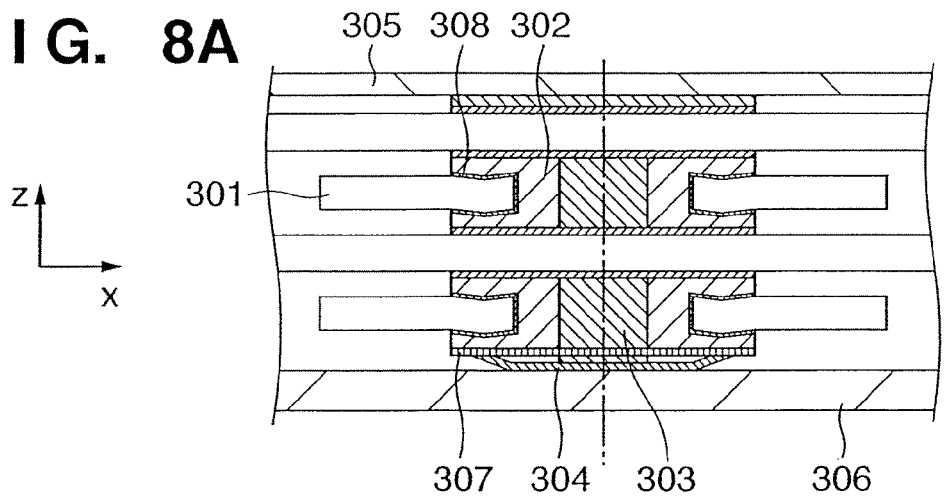
FIGS. 8A to 8D are views showing a coil support unit using a wedge coil.
Figure 8B:
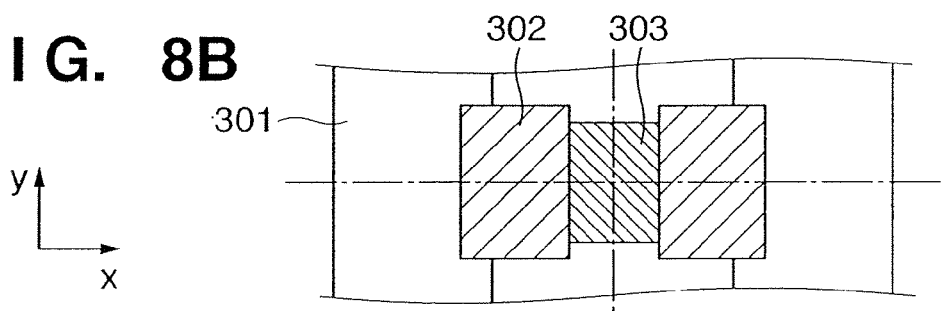
Figure 8C:
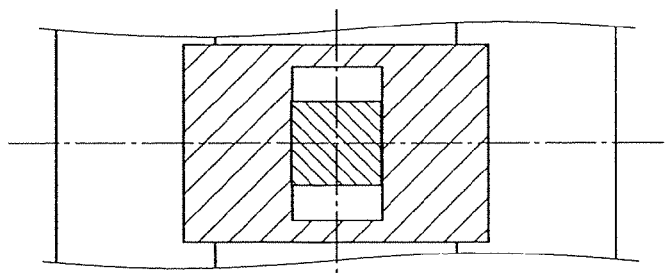
Figure 8D:
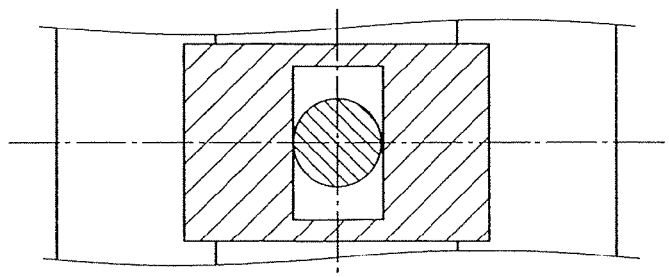

FIGS. 8A to 8D show the fourth embodiment of the present invention. FIG. 8A is an enlarged view of a coil support unit seen from a Y direction. FIG. 8B is a view of a coil having an elliptical portion in the Y direction (e.g., the coil on the second layer in FIG. 8A), seen from a Z direction. A detailed description of the arrangement similar to the first embodiment will be omitted. In the fourth embodiment, the coil can slide with a spacer as in the third embodiment.

In this method, the cross section of a coil 301 has a wedge shape in a winding direction (a Y direction in FIG. 8A) to geometrically constrain the coil. In FIGS. 8A to 8D, the cross sections of a group of multilayered, substantially elliptical coils 301 juxtaposed in the X or Y direction have wedge shapes. The plurality of wedge portions are vertically sandwiched by spacers 302 in the Z direction, successively stacked to common ribs 303, to receive the preload forces by a cone disc spring 304, and to support the coils between a jacket wall 306 and a jacket ceiling plate 305.

The space between the spacers 302 inserted into the coils is the same as that between the common ribs 303. The positions of the vertically multilayered coils on the respective layers are defined by abutting the spacers of the coils. In this case, when applying the thrust to the coil, the coil 301 is constrained in the thrust direction by the effect of the wedge shape. On the other hand, since there is no condition for constraining the coil in the major-axis direction of the coil, the coil can slide to move. In this case, a protective tape 308 is adhered on the sliding portion of the coil 301 to prevent a short circuit which occurs, e.g., when an insulating film is peeled off by sliding the coil. In this method, since the coil 301 need not be fixed to the spacer 302 by adhesion, or the like, assembly efficiency remarkably increases, and the coil support unit can be entirely disassembled and maintained after being assembled.

The preload force applied by the cone disc spring 304 suppresses the play caused by the dimensional error in the Z direction of the spacer 302 to constrain and to support the spacer 302. When the preload force is small, friction is also small. Hence, the thermal expansion force of the coil can be efficiently relieved, and a large stress does not act on the coil 301 and the spacer 302.

Figure 9A:
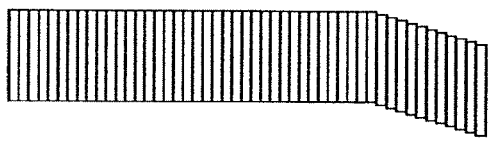
FIGS. 9A to 9E are views each showing the cross section of the wedge coil.
Figure 9A:
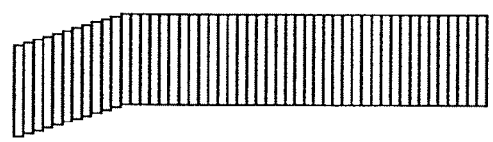
Figure 9B:
Figure 9B:
Figure 9C:
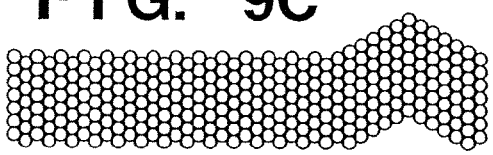
Figure 9C:
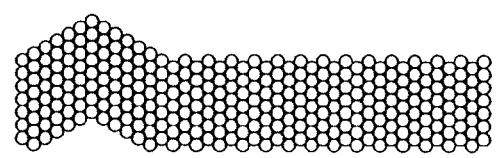
Figure 9D:
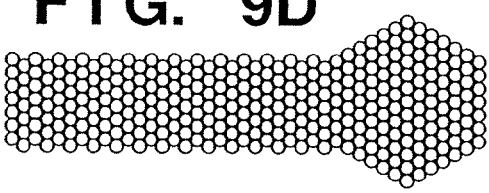
Figure 9D:
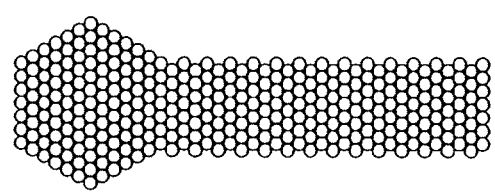
Figure 9E:
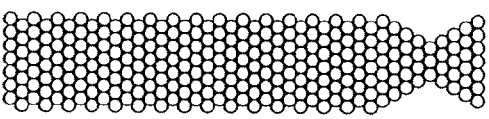
Figure 9E:
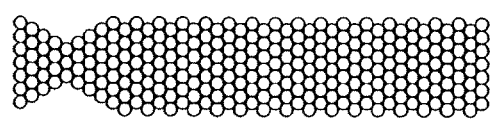

FIGS. 9A to 9E show other examples of the cross sections of a wedge coil. FIGS. 9A and 9B show examples of the wedge coils using flat wires. The cross section on the coil support member side (the inner circumferential side of the coil in this case) has a wedge shape. FIGS. 9C to 9D, and 9E show examples of the cross sections of the wedge coils using round wires. When using the round wires, the length of the cross section can be freely changed, unlike the flat wires, thereby implementing various wedge shapes. Note that even when flat wires are used, the cross section can be the same as that of the round wires by processing the wires. The wedge shape can be varied as long as the constraining and sliding directions of the coil can be defined. Also, a wedge-shaped guide may be attached to the flat coil afterwards.

The above embodiment can be applied to the support of all coils. However, it is especially effective to support many coils, as in the plane motor, or to support a long coil, such as a substantially elliptical coil.

Also, a channel for causing a coolant to flow between the coils can be sufficiently ensured to efficiently cool the coils.

Fifth Embodiment

Figure 10:
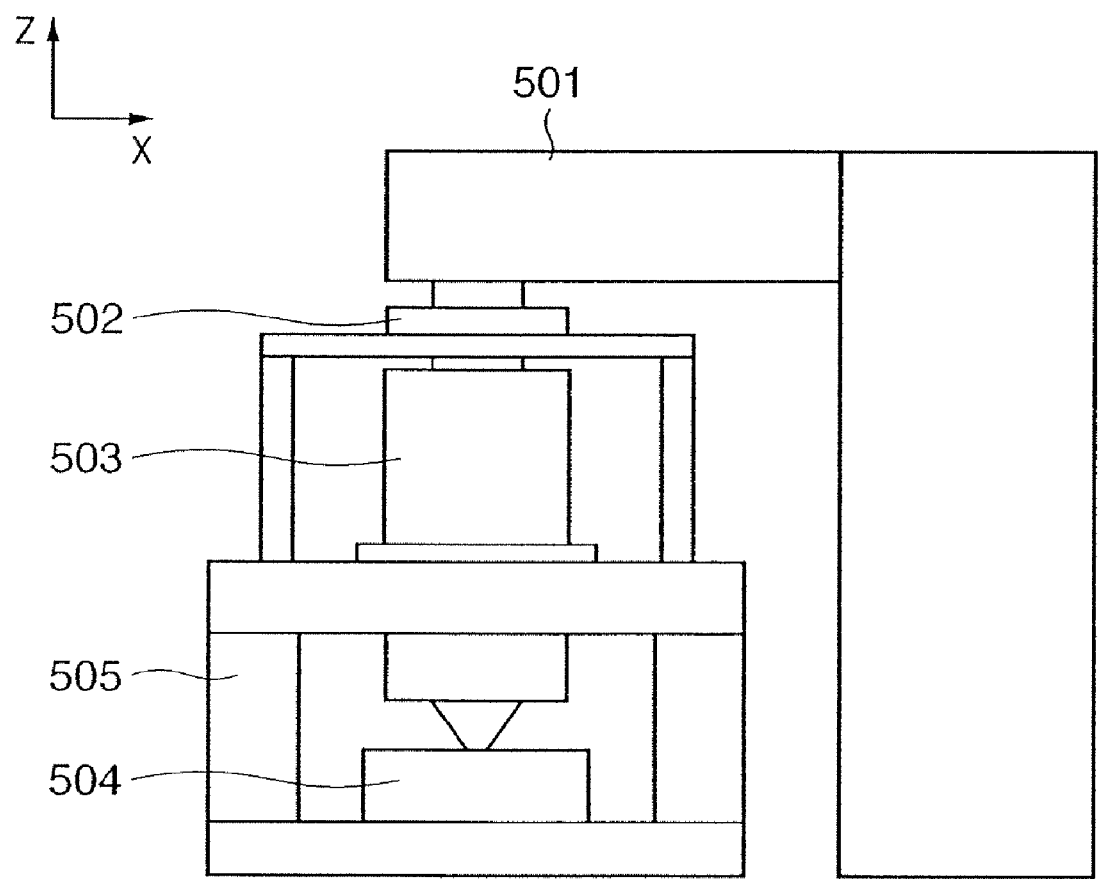
FIG. 10 is a view showing an exposure apparatus.

FIG. 10 shows a semiconductor device manufacturing exposure apparatus, which uses a stage apparatus similar to that described above as a wafer stage.

This exposure apparatus is used for the manufacture of semiconductor devices, such as a semiconductor integrated circuit, and devices, such as a micromachine and thin-film magnetic head, on which a fine pattern is formed. A semiconductor wafer W as a substrate is irradiated with exposure light (this term is a general term for visible light, ultraviolet light, EUV light, X-rays, an electron beam, a charged particle beam, and the like) as exposure energy from an illumination system unit 501 through a reticle as a master via a projection lens 503 (this term is a general term for a dioptric lens, a reflecting lens, a cata-dioptric lens system, a charged particle lens, and the like) as a projection system, to form a desired pattern on the substrate mounted on a wafer stage 504. In this exposure apparatus, as the wavelength of the exposure light becomes short, the exposure in a vacuum atmosphere is required.

The wafer (object) serving as the substrate is held on the chuck mounted on the wafer stage 504. The pattern of the reticle serving as the master mounted on a reticle stage 502 is transferred on each region on the wafer by a step-and-repeat or a step-and-scan method by the illumination system unit 501. Note that the stage device according to the first embodiment is used as the wafer stage 504 or the reticle stage 502.

Sixth Embodiment

A semiconductor device manufacturing process using the exposure apparatus will be described.

Figure 11:
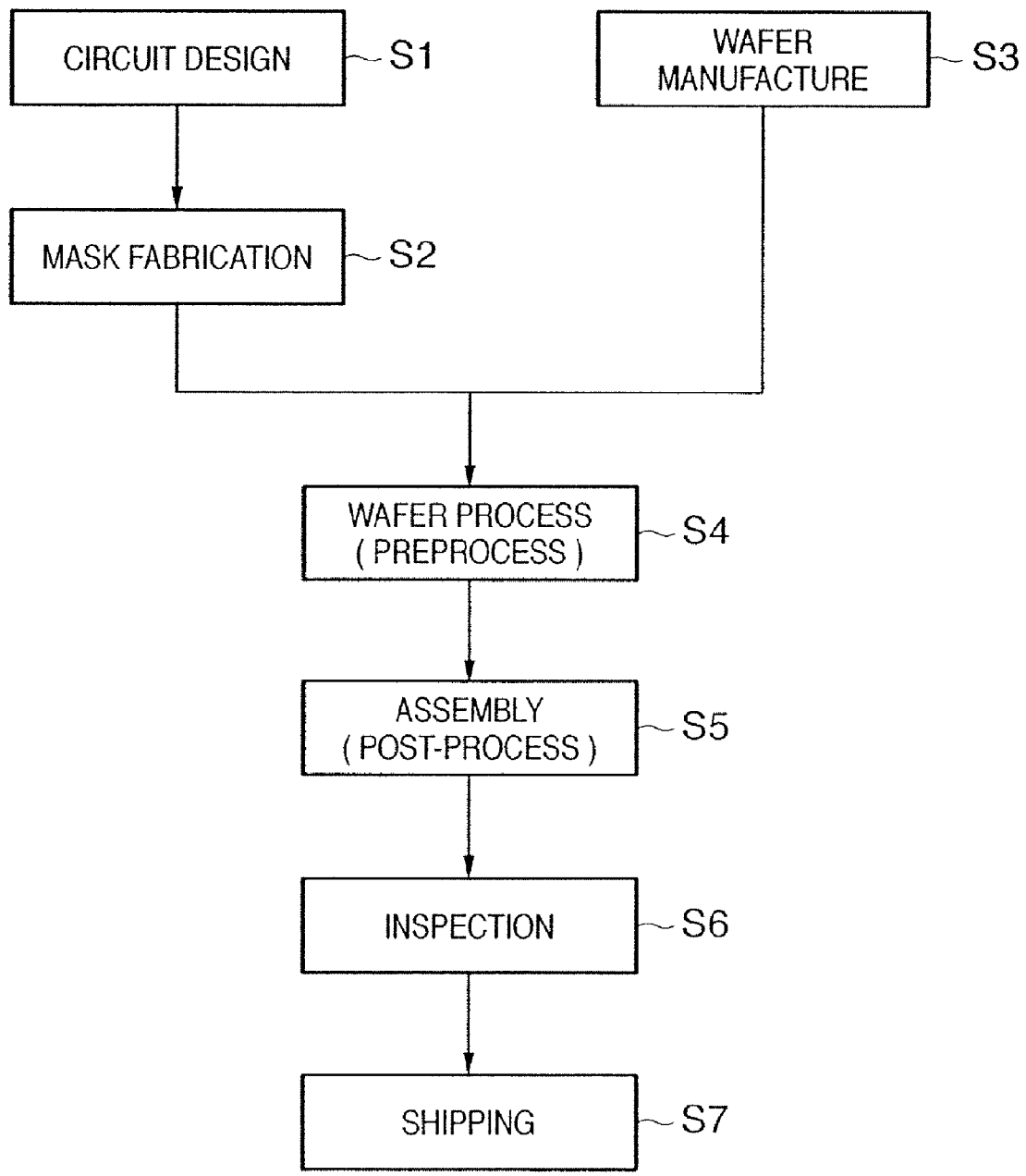
FIG. 11 is a view showing a device manufacturing method.
Figure 12:
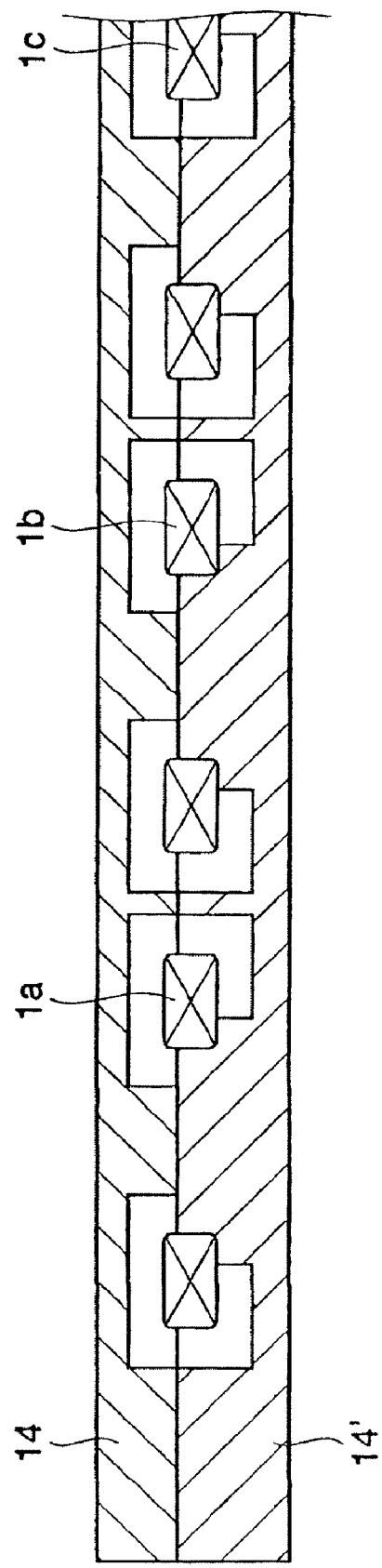
FIG. 12 is a view showing a conventional coil support unit.

FIG. 11 is a flow chart of an overall semiconductor device manufacturing process. In step 1 (circuit design), the circuit of a semiconductor device is designed. In step 2 (mask fabrication), a mask is fabricated based on the designed circuit pattern.

In step 3 (wafer manufacture), a wafer is manufactured using a material such as silicon. In step 4 (wafer process), called a preprocess, an actual circuit is formed on the wafer by the exposure apparatus described above in accordance with lithography using the prepared mask and wafer. In step 5 (assembly), called a post-process, a semiconductor chip is formed from the wafer fabricated in step 4. This step includes processes such as assembly (dicing and bonding) and packaging (chip encapsulation). In step 6 (inspection), inspections such as an operation check test and a durability test of the semiconductor device fabricated in step 5 are performed. A semiconductor device is completed with these processes, and is shipped, in step 7.

The wafer process of step 4 has the following steps: an oxidation step of oxidizing the surface of the wafer, a CVD step of forming an insulating film on the wafer surface, an electrode formation step of forming an electrode on the wafer by deposition, an ion implantation step of implanting ions into the wafer, a resist process step of implanting ions into the wafer, a resist process step of applying a photosensitive agent to the wafer, an exposure step of transferring the circuit pattern to the wafer after the resist process step by the exposure apparatus described above, a developing step of developing the wafer exposed in the exposure step, an etching step of etching portions other than the resist image developed in the developing step, and a resist removing step of removing any unnecessary resist remaining after etching. By repeating these steps, a multilayered structure of circuit patterns is formed on the wafer.

As many apparently widely different embodiments of the present invention can be made without departing from the spirit and scope thereof, it is to be understood that the invention is not limited to the specific embodiments thereof except as defined in the appended claims.

What is claimed is:

1. A motor apparatus comprising:
a plurality of coils arranged along a first direction in a plane perpendicular to central axes thereof;
a plurality of magnets each configured to generate a force in cooperation with the coils; and
a support member supporting the plurality of coils,
wherein movement of the coils in the first direction due to thermal deformation of the coils is constrained by the coils contacting with a surface of the support member, and
movement of the coils in a second direction, which is in the plane and perpendicular to the first direction, due to thermal deformation of the coils, is allowed by the coils sliding in the second direction along the surface.

2. The apparatus according to claim 1, wherein the coils form substantially elliptical coils, and the second direction is a longitudinal direction of the coils.

3. The apparatus according to claim 1, wherein the coils include a wedge portion at which the coils are supported.

4. The apparatus according to claim 1, wherein a protection member is provided to the surface of the supporting member.

5. The apparatus according to claim 1, wherein the coils include multi-layered coils stacked in a third direction perpendicular to the first and second directions.

6. The apparatus according to claim 5, wherein the support member includes a rib, and the rib is configured to support the multi-layered coils.

7. The apparatus according to claim 5, further comprising a preload force applying mechanism configured to apply a preload force to the multi-layered coils in the third direction, wherein the preload force applying mechanism is arranged to the coils on the opposite side of the magnets in the third direction.

8. An exposure apparatus comprising:
(a) a stage configured to move while holding a substrate or an original; and
(b) a motor configured to drive the stage,
wherein the motor includes:
(i) a plurality of coils arranged along a first direction in a plane perpendicular to central axes thereof;
(ii) a plurality of magnets each configured to generate a force in cooperation with the coils; and
(iii) a support member supporting the plurality of coils, movement of the coils in the first direction due to thermal deformation of the coils being constrained by the coils contacting with a surface of the support member, and movement of the coils in a second direction, which is in the plane and perpendicular to the first direction, due to thermal deformation of the coils being allowed by the coils sliding in the second direction along the surface.

9. A device manufacturing method comprising:
exposing a substrate using an exposure apparatus as defined in claim 8; and
developing the substrate.

10. A motor apparatus comprising:
a plurality of coils arranged along a first direction in a plane perpendicular to central axes thereof;
a plurality of magnets each configured to generate a force in cooperation with the coils;
a support member supporting the plurality of coils; and
a plurality of spacers arranged between the support member and the plurality of coils,
wherein movement of the coils in the first direction due to thermal deformation of the coils is constrained by the spacers contacting with a surface of the support member, and
movement of the coils in a second direction, which is in the plane and perpendicular to the first direction, due to thermal deformation of the coils is allowed by the spacers sliding in the second direction along the surface.

11. The apparatus according to claim 10, wherein the coils form substantially elliptical coils, and the second direction is a longitudinal direction of the coils.

12. The apparatus according to claim 10, further comprising:
a member contacting with at least one of the spacers; and
an adjusting unit configured to adjust a frictional force acting between the member and the spacer by changing a force pushing the member against the spacers.

13. An exposure apparatus comprising:
(a) a stage configured to move while holding a substrate or an original; and
(b) a motor configured to drive the stage,
wherein the motor includes:
(i) a plurality of coils arranged along a first direction in a plane perpendicular to central axes thereof;
(ii) a plurality of magnets each configured to generate a force in cooperation with the coils;
(iii) a support member supporting the plurality of coils; and
(iv) a plurality of spacers arranged between the support member and the plurality of coils, wherein movement of the coils in the first direction due to thermal deformation of the coils is constrained by the spacers contacting with a surface of the supporting member, and movement of the coils in a second direction, which is in the plane and perpendicular to the first direction, due to thermal deformation of the coils is allowed by the spacers sliding in the second direction along the surface.

14. A device manufacturing method comprising:
exposing a substrate using an exposure apparatus as defined in claim 13; and
developing the substrate.

15. A motor apparatus comprising:
a plurality of coils arranged along a first direction in a plane perpendicular to central axes thereof;
a plurality of magnets each configured to generate a force in cooperation with the coils;
a support member extending along the central axes of the plurality of coils; and
a plurality of spacers arranged between the support member and the plurality of coils,
wherein the spacer includes an opening, an inner surface of which is in contact with the support member, and a leaf spring connecting to the coils, a direction along a thickness of the leaf spring being parallel to a second direction, which is in the plane perpendicular to the first direction.

16. An exposure apparatus comprising:
(a) a stage configured to move while holding a substrate or an original; and
(b) a motor configured to drive the stage,
wherein the motor includes:
(i) a plurality of coils arranged along a first direction in a plane perpendicular to central axes thereof;
(ii) a plurality of magnets each configured to generate a force in cooperation with the coils;
(iii) a support member extending along the central axes of the plurality of coils; and
(iv) a plurality of spacers arranged between the support member and the plurality of coils, the spacers including an opening, an inner surface of which is in contact with the support member, and a leaf spring connecting to the coils, a direction along a thickness of the leaf spring being parallel to a second direction, which is in the plane and perpendicular to the first direction.

17. A device manufacturing method comprising:
exposing a substrate using an exposure apparatus as defined in claim 16; and
developing the substrate.

18. A motor apparatus comprising:
a plurality of coils arranged along a first direction in a plane perpendicular to central axes thereof;
a plurality of magnets each configured to generate a force in cooperation with the coils; and
a support member supporting the plurality of coils,
wherein the movement of the coils in the first direction due to deformation of the coils is constrained by the coils contacting with a surface of the support member, and
movement of the coils in a second direction, which is in the plane and perpendicular to the first direction, due to deformation of the coils, is allowed by the coils sliding in the second direction along the surface.

19. A motor apparatus comprising:
a movable magnet;
coils arranged along a first direction in a plane perpendicular to central axes thereof, a force in the first direction being generated between the magnet and each of the coils;
coil supporting members configured to support the plurality of coils; and
spacers fixed to the coils and arranged at portions facing the coil supporting members,
wherein movement of the coils in the first direction due to thermal deformation of the coils is constrained by the spacers contacting with surfaces of the coil supporting members, and
movement of the coils in a second direction, which is in the plane and perpendicular to the first direction, due to thermal deformation of the coils, is allowed by the spacers sliding, relative to the coil support members, in the second direction along the surfaces.

20. A motor apparatus comprising:
a movable magnet;
coils arranged along a first direction in a plane perpendicular to central axes thereof, a force in the first direction being generated between the magnet and each of the coils;
coil supporting members configured to support the plurality of coils; and
spacers fixed to the coils and arranged at portions facing the coil supporting members,
wherein movement of the coils in the first direction due to deformation of the coils is constrained by the spacers contacting with surfaces of the coil supporting members, and movement of the coils in the second direction, which is in the plane and perpendicular to the first direction, due to deformation of the coils, is allowed by the spacers sliding, relative to the coil support members, in the second direction along the surfaces.

21. An exposure apparatus comprising:
(a) a stage configured to move while holding a substrate or an original; and
(b) a motor configured to drive the stage, wherein the motor includes:
  (i) a movable magnet attached to the stage;
  (ii) coils arranged along a first direction in a plane perpendicular to central axes thereof, a force in the first direction being generated between the magnet and each of the coils;
  (iii) coil supporting members configured to support the plurality of coils; and
  (iv) spacers fixed to the coils and arranged at portions facing the coil supporting members,
wherein movement of the coils in the first direction due to deformation of the coils is constrained by the spacers contacting with surfaces of the coil supporting members, and
movement of the coils in the second direction, which is in the plane and perpendicular to the first direction, due to deformation of the coils, is allowed by the spacers sliding, relative to the coil support members, in the second direction along the surfaces.

* * * * *